(12) United States Patent
Qian

(10) Patent No.: US 9,692,187 B2
(45) Date of Patent: Jun. 27, 2017

(54) ASSEMBLY OF CABLE CONNECTION APPARATUS AND ELECTRICAL CONNECTOR

(71) Applicant: LOTES CO., LTD, Keelung (TW)

(72) Inventor: Jian Cheng Qian, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 14/940,663

(22) Filed: Nov. 13, 2015

(65) Prior Publication Data
US 2017/0077655 A1  Mar. 16, 2017

(30) Foreign Application Priority Data

Sep. 10, 2015 (CN) .................... 2015 2 0698124 U

(51) Int. Cl.
| | | |
|---|---|---|
| H01R 12/00 | (2006.01) | |
| H01R 13/66 | (2006.01) | |
| H01R 24/60 | (2011.01) | |
| H01R 107/00 | (2006.01) | |
| H01R 12/62 | (2011.01) | |
| H05K 3/34 | (2006.01) | |

(52) U.S. Cl.
CPC .......... *H01R 13/665* (2013.01); *H01R 24/60* (2013.01); *H01R 12/62* (2013.01); *H01R 2107/00* (2013.01); *H05K 3/3442* (2013.01)

(58) Field of Classification Search
None
See application file for complete search history.

(56) References Cited

U.S. PATENT DOCUMENTS

| | | | | |
|---|---|---|---|---|
| 4,357,647 A | * | 11/1982 | Hadersbeck | ......... H05K 3/3415 361/767 |
| 5,074,806 A | * | 12/1991 | Korsunsky | ........... H01R 23/662 439/497 |
| 6,123,588 A | * | 9/2000 | Johnston | ................ H01R 12/62 439/493 |
| 8,002,555 B2 | * | 8/2011 | Lee | .................... H01R 13/4538 439/49 |
| 2010/0048059 A1 | * | 2/2010 | Lee | .................... H01R 13/4538 439/607.28 |

* cited by examiner

*Primary Examiner* — Tho D Ta
(74) *Attorney, Agent, or Firm* — Locke Lord LLP; Tim Tingkang Xia, Esq.

(57) ABSTRACT

An assembly of a cable connection apparatus and an electrical connector, includes a mating plug having an insulating body and multiple terminals, a circuit board having a notch depressed from an edge at a side of the circuit board toward a center direction of the circuit board and a metal conductor disposed in the notch or at an edge of the notch, and a cable having at least one conducting wire. The terminals are conducted to the circuit board. The conducting wire is inserted into the corresponding notch along a depression direction of the notch, and conducted to the metal conductor, thereby reducing the height of a soldering end of the conducting wire protruding from a surface of the circuit board. Thus, a metal casing outside the circuit board may wrap the circuit board without having a protruding portion for reserving the soldering end.

31 Claims, 8 Drawing Sheets

ASSEMBLY OF CABLE CONNECTION APPARATUS AND ELECTRICAL CONNECTOR

CROSS-REFERENCE TO RELATED APPLICATION

This non-provisional application claims priority under 35 U.S.C. §119(a) on Patent Application No. 201520698124.1 filed in P.R. China on Sep. 10, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an assembly of a cable connection apparatus and an electrical connector, and more particularly to an assembly of a cable connection apparatus and an electrical connector in which an edge of a circuit board is provided with a notch, and a cable is soldered to the notch and conducted to the circuit board.

BACKGROUND OF THE INVENTION

A cable in an electrical connector currently used in the industry is generally soldered to a surface of a circuit board by surface-mount technology (SMT), and therefore after the surface of the circuit board is soldered to a conducting wire, a soldering end of the conducting wire inevitably obviously protrudes from the surface of the circuit board. Therefore, two protruding portions protrude from a position that is on a surface of a metal shell outside the circuit board and corresponds to the soldering end of the conducting wire, and reserve the soldering end of the conducting wire. However, in this way, the thickness of the entire metal shell is increased, thereby increasing the thickness of the electrical connector, which is unfavorable to design a miniature, light and thin electrical connector. As the current connector is increasingly light and thin, to prevent the metal shell from being excessively thick, a position that is on the surface of the metal shell and corresponds to the soldering end of the conducting wire is provided with an opening, so as to reserve the soldering end of the conducting wire. However, in this method, the soldering end of the conducting wire is exposed from the metal shell, so that the metal shell cannot shield signal interference from the soldering end of the conducting wire, which affects signal transmission quality of the electrical connector.

Therefore, a heretofore unaddressed need exists in the art to address the aforementioned deficiencies and inadequacies.

SUMMARY OF THE INVENTION

In one aspect, the present invention relates to an electrical connector that can reduce a soldering height of a cable on a circuit board.

In one embodiment, an assembly of a cable connection apparatus and an electrical connector includes: a mating plug, a circuit board and a cable. The mating plug has an insulating body. Multiple terminals are disposed at the insulating body, and are electrically conducted to the circuit board. At least one notch is depressed from an edge at a side of the circuit board toward a center direction of the circuit board, and a metal conductor is disposed in the notch or at an edge of the notch. The cable has at least one conducting wire, and the conducting wire is directly faced with a depression direction of the notch, inserted into the notch and conducted to the metal conductor.

In one embodiment, the conducting wire is cylindrical, and a center line of the conducting wire is at an equal distance to two opposite outer surfaces of the circuit board.

In one embodiment, a cross-sectional diameter of the conducting wire is greater than the thickness of the circuit board.

In one embodiment, a cross-sectional diameter of the conducting wire is less than the thickness of the circuit board.

In one embodiment, the notch is in a shape of U, and the metal conductor is attached to an inner wall of the notch.

In one embodiment, two opposite inner surfaces of the metal conductor are attached to a surface of the conducting wire.

In one embodiment, the width of the notch is gradually widened in a direction from an edge of the circuit board to the center of the circuit board.

In one embodiment, there are at least three notches, the notches are arranged in a row, and the width of a head notch and the width of a tail notch are greater than the width of a middle notch.

In one embodiment, there are at least three notches, the notches are arranged in a row, and the depth of a middle notch is greater than the depth of a head notch and the depth of a tail notch.

In one embodiment, there are at least three conducting wires, the conducting wires are distributed corresponding to the notches, each of the conducting wires is further wrapped with an insulating layer, a middle insulating layer partially enters the corresponding notch, and the depth by which the middle insulating layer enters the corresponding notch is greater than or equal to the depth of the head notch and the depth of the tail notch.

In one embodiment, an insertion direction of the mating plug is at 90 degrees relative to a direction in which the cable is inserted into the notch.

In one embodiment, the metal conductor includes a first metal conductor, that is completely tightly attached to an inner wall of the notch, and a second metal conductor, that extends out of the notch from the first metal conductor to a surface of the circuit board and is tightly attached to upper and lower surfaces of the circuit board.

In one embodiment, the second metal conductor is perpendicular to the first metal conductor, and two second metal conductors located at the upper and lower surfaces of the circuit board are parallel to each other.

In one embodiment, the circuit board has a first area and a second area that are distributed at two ends of the circuit board, the notch is located at the second area, an open slot is depressed from a side edge of the circuit board, the open slot is located between the first area and the second area, and the mating plug is disposed at a side of the circuit board, connected to the first area and locked in the open slot.

In one embodiment, a locking slot is depressed from the open slot in a direction toward the first area, and the locking slot runs through the upper and lower surfaces of the circuit board, and is locked in the insulating body.

In one embodiment, the electrical connector further includes a positioning block, the circuit board is further wrapped with a metal shell, the metal shell is formed by assembling a first metal shell and a second metal shell, the first metal shell and the second metal shell have a first side wall and a second side wall respectively, the first side wall and the second side wall are parallel to the depression direction of the notch, the first side wall has a mating ring, the mating plug passes through the mating ring and is electrically conducted to the circuit board, the second side wall has a positioning ring, and the positioning block passes through the positioning ring and is fixed to the circuit board.

In one embodiment, the circuit board is further wrapped with a metal shell, the metal shell is formed by assembling a first metal shell and a second metal shell vertically, a front end of the first metal shell has a mating ring, the mating plug passes through the mating ring and is electrically conducted to the circuit board, the second metal shell has a top wall, the top wall extends forward and is bent downward to form a buckling portion, and the buckling portion buckles a front end of the mating ring.

In one embodiment, the mating plug is a universal serial bus (USB) Type C male plug connector.

In another aspect, the present invention relates to an cable connection apparatus. In one embodiment, an cable connection apparatus includes a circuit board and a cable. Multiple conducting channels are disposed at the circuit board. At least one notch is depressed from an edge at a side of the circuit board toward a center direction of the circuit board. A metal conductor is correspondingly disposed in the notch or at an edge of the notch, and the metal conductor is electrically conducted to at least one of the conducting channels. The cable has at least one conducting wire, and the conducting wire is directly faced with a depression direction of the notch, is inserted into the notch and contacts the metal conductor.

In one embodiment, the conducting wire is cylindrical, and a center line of the conducting wire is at an equal distance to two opposite outer surfaces of the circuit board.

In one embodiment, the notch is in a shape of U, and the metal conductor is attached to an inner wall of the notch.

In one embodiment, there are at least three notches, the notches are arranged in a row, and the width of a head notch and the width of a tail notch are greater than the width of a middle notch.

In one embodiment, there are at least three notches, the notches are arranged in a row, and the depth of a middle notch is greater than the depth of a head notch and the depth of a tail notch.

In one embodiment, there are at least three conducting wires, the conducting wires are distributed corresponding to the notches, each of the conducting wires is further wrapped with an insulating layer, a middle insulating layer partially enters the corresponding notch, and the depth by which the middle insulating layer enters the corresponding notch is greater than or equal to the depth of the head notch and the depth of the tail notch.

Compared with the related art, certain embodiments of the present invention have the following beneficial advantages.

In the assembly of a cable connection apparatus and an electrical connector, an edge of a circuit board is provided with a notch, the conducting wire enters the notch and is soldered to the circuit board, thereby reducing the height by which a soldering end of the conducting wire protrudes from a surface of the circuit board after the conducting wire is soldered to the circuit board, so that a metal casing outside the circuit board may still wrap the circuit board without being provided with a protruding portion for reserving the soldering end, which facilitates lightening and thinning design of the electrical connector, and meanwhile the soldering end of the conducting wire can achieve a good shielding effect, thereby improving signal transmission quality of the circuit board.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
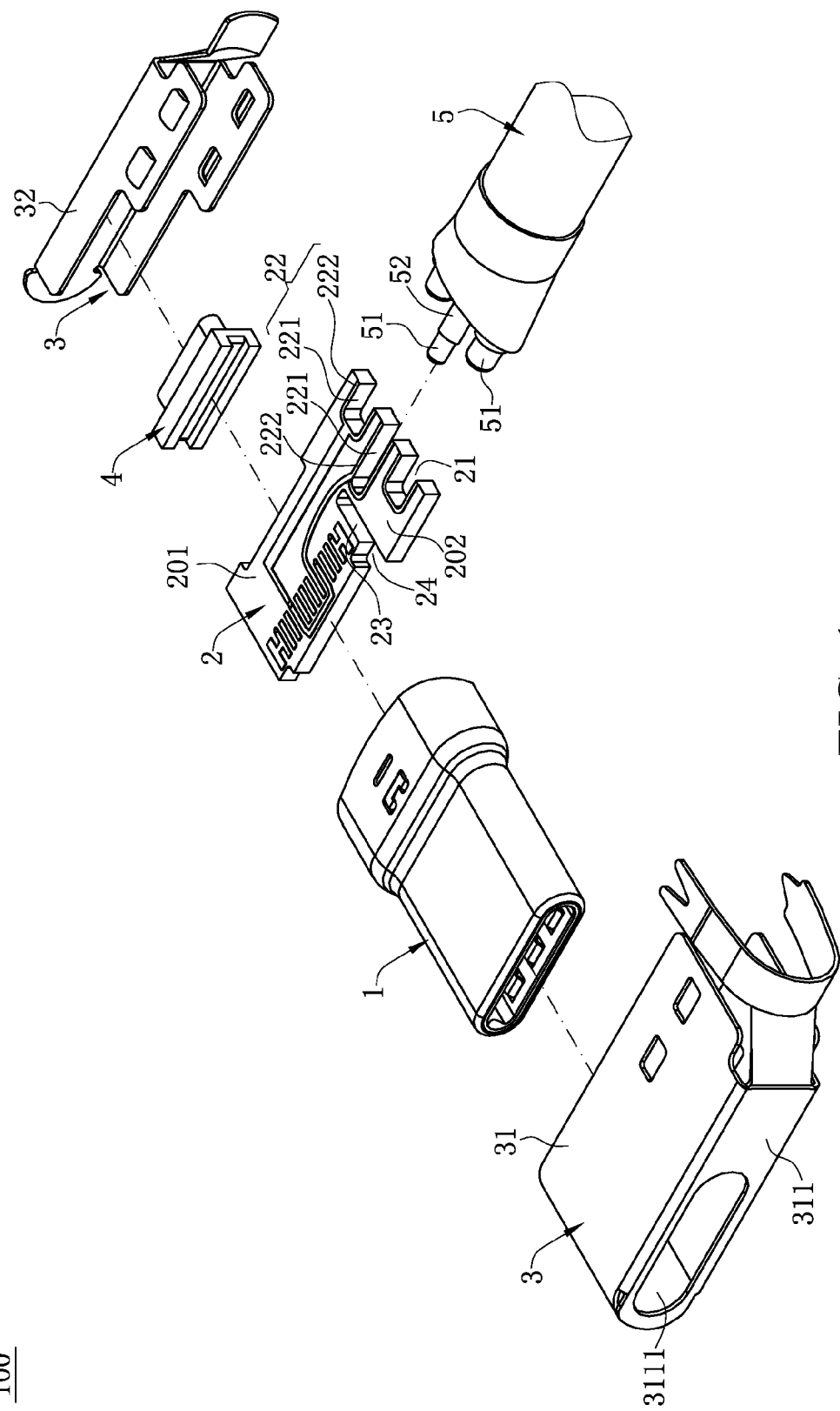
FIG. 1 is a schematic three-dimensional exploded view of a first embodiment of an assembly of a cable connection apparatus and an electrical connector according to the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the"

includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an assembly of a cable connection apparatus and an electrical connector.

Figure 2:
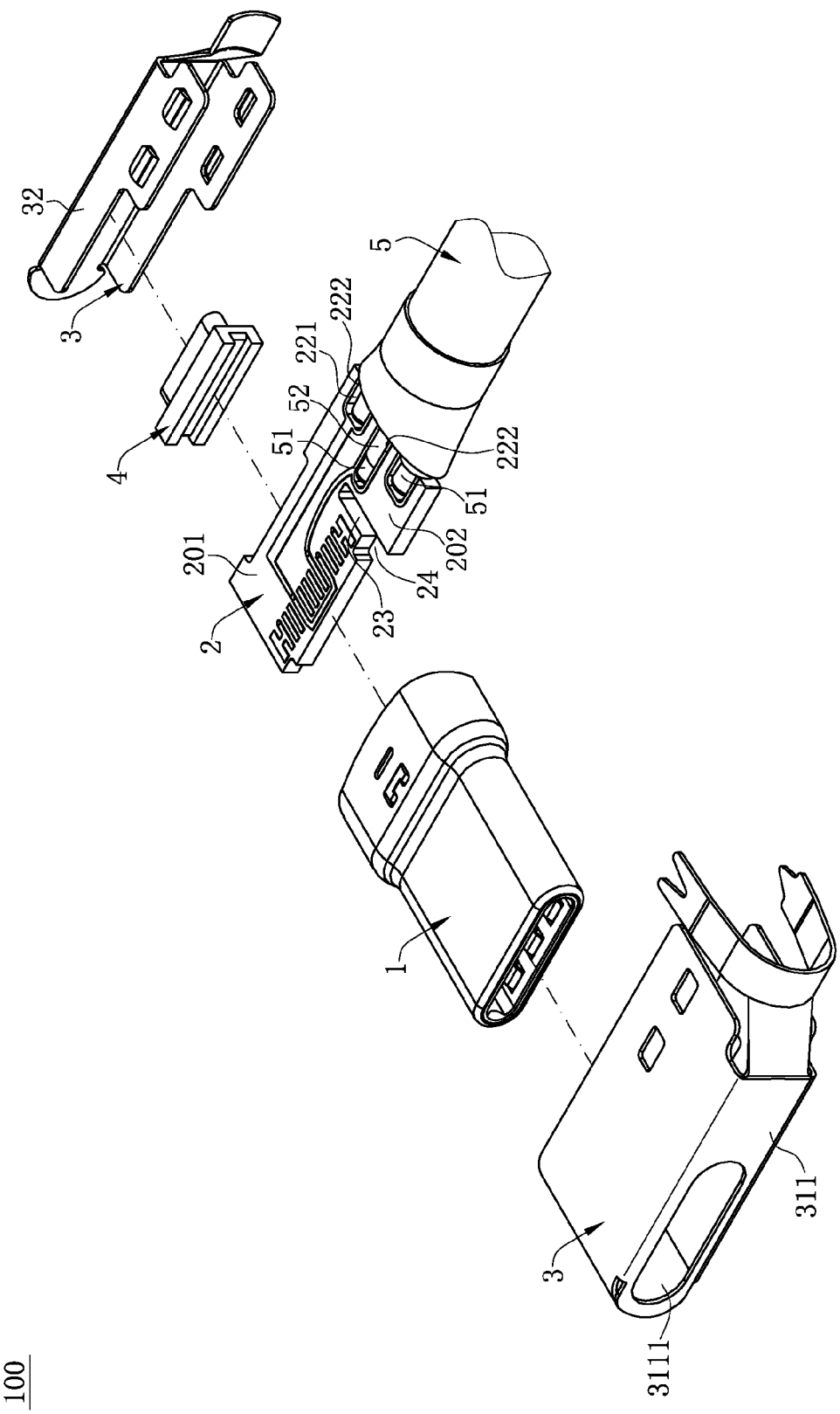
FIG. 2 is a partial three-dimensional exploded view of a first embodiment of an assembly of a cable connection apparatus and an electrical connector according to the present invention.

As shown in FIGS. 1 and 2, an assembly 100 of a cable connection apparatus and an electrical connector according to one embodiment of the present invention includes a mating plug 1, a circuit board 2, a metal shell 3, a positioning portion 4 and a cable 5. The mating plug 1 is electrically conducted to the circuit board 2. The metal shell 3 wraps the circuit board 2. The positioning portion fixes the circuit board 2 inside the metal shell 3, and the positioning portion is a separately formed positioning block 4. The positioning block 4 passes through the metal shell 3 and is fixed to the circuit board 2. The cable 5 is electrically conducted to the circuit board 2.

Figure 4:
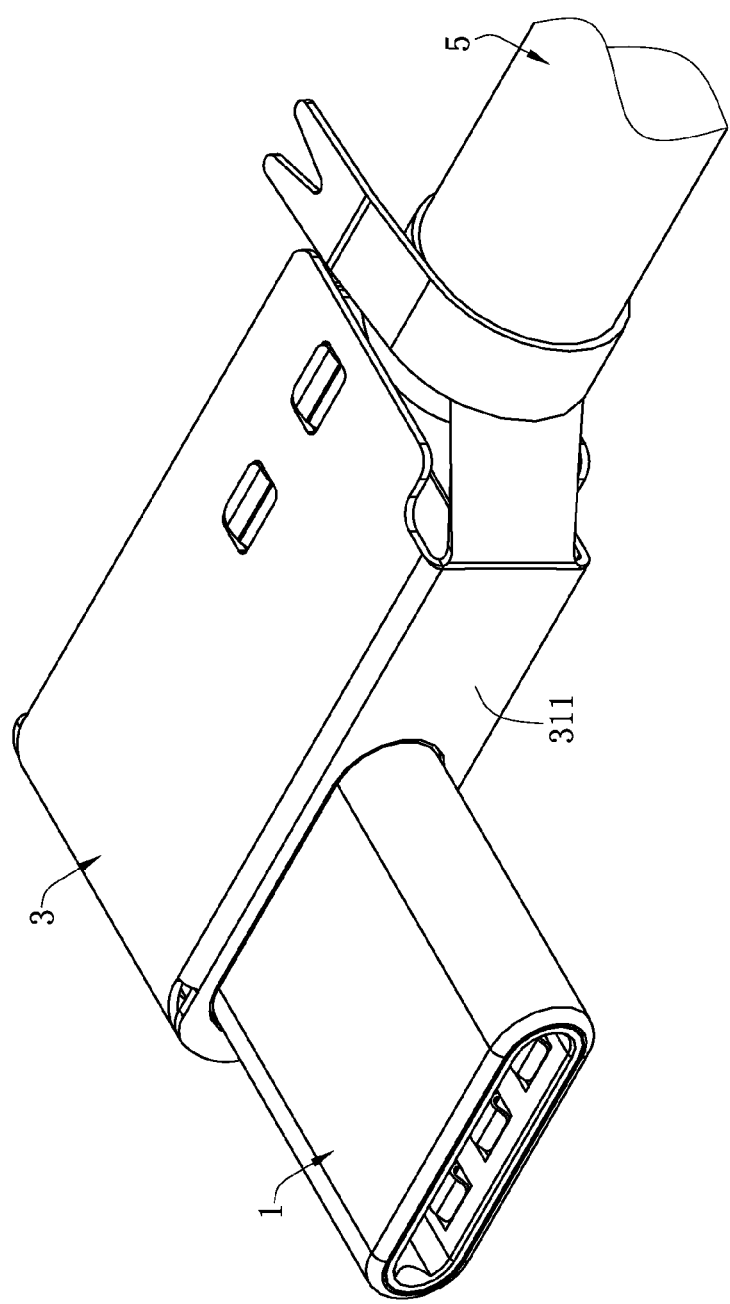
FIG. 4 is a schematic three-dimensional assembly view of a first embodiment of an assembly of a cable connection apparatus and an electrical connector according to the present invention.

As shown in FIGS. 2 and 4, the mating plug 1 has an insulating body (not labeled). Multiple terminals (not labeled) are disposed at the insulating body and electrically conducted to the circuit board 2. The mating plug 1 has a first portion (not labeled) and a second portion (not labeled). The first portion is located inside the metal shell 3, and the second portion is located outside the metal shell 3. In this embodiment, the mating plug 1 is a USB Type C male plug connector. In other embodiments, the mating plug 1 may be an electrical connector in any form, as long as the mating plug 1 is electrically conducted to the circuit board 2, which is not limited herein.

Figure 5:
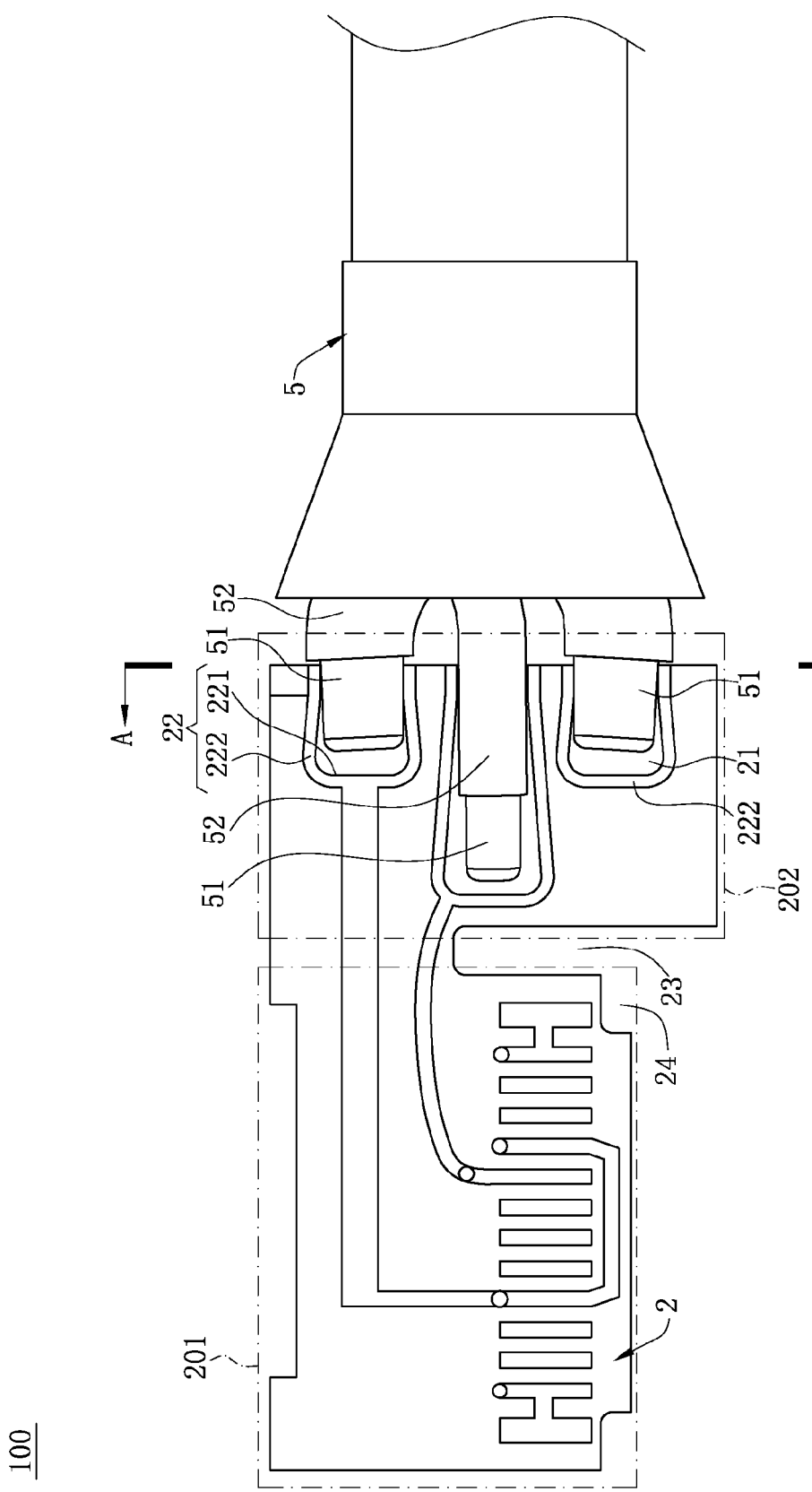
FIG. 5 is a schematic diagram of soldering between a cable and a circuit board of a first embodiment of an assembly of a cable connection apparatus and an electrical connector according to the present invention.

As shown in FIGS. 1, 2 and 5, the cable 5 includes three conducting wires 51. The conducting wires 51 are cylindrical. Each of the conducting wires 51 is further wrapped with an insulating layer 52, thereby preventing adjacent conducting wires 51 from contacting each other to be short-circuited. Three notches 21 are depressed from an edge at a side of the circuit board 2 toward a center direction of the circuit board 2. Each of the notches 21 is in a "U" shape, and an opening width of the notch 21 is slightly less than a cross-sectional diameter of the corresponding conducting wire 51. At least one metal conductor 22 is disposed on the circuit board 2. Each metal conductor 22 is completely tightly attached to an inner wall of the notch 21, extends to a surface of the circuit board 2, and is electrically conducted to a corresponding conducting channel (not labeled) on the circuit board 2. In this embodiment, each metal conductor 22 includes a first metal conductor 221 and a second metal conductor 222. The first metal conductor 221 is completely tightly attached to an inner wall of the notch 21. The second metal conductor 222 extends out of the notch 21 from the first metal conductor 221 to a surface of the circuit board 2, and is tightly attached to upper and lower surfaces of the circuit board 2, so that the second metal conductor 222 can be connected to the conducting channel (not labeled). The metal conductor 22 completely wraps the notch 21, thereby increasing a contact area between the metal conductor 22 and the conducting wire 51, and improving signal transmission stability of the conducting wire 51. In addition, the second metal conductor 222 is perpendicular to the first metal conductor 221, and two second metal conductors 222 located at the upper and lower surfaces of the circuit board 2 are parallel to each other. In this way, it may be ensured that the metal conductors 22 are orderly arranged on the circuit board, thereby preventing the metal conductors 22 wrapping different notches 21 from being connected and short-circuited. When an operator intends to solder the conducting wire 51 to the circuit board 2, the conducting wire 51 is first directly faced with a depression direction of the corresponding notch 21 and inserted into the notch 21. Meanwhile, a center line of the conducting wire 51 is at an equal distance to two opposite outer surfaces of the circuit board 2. The cylindrical conducting wire 51 may be in interference fit with the "U" shaped notch 21, thereby ensuring that the conducting wire 51 is in tight contact with the metal conductor 22, and then the two are soldered together, so that the conducting wire 51 is fixed to the circuit board 2. In other embodiments, the quantity of the conducting wires 51 may be increased or reduced according to actual needs, the quantity of the notches 21 changes corresponding to the quantity of the conducting wires 51, and the metal conductor 22 may cover the inner wall of the notch 21, or only covers a surface of the circuit board 2 and is located at an edge of the notch 21, as long as the metal conductor 22 is soldered to the conducting wire 51, which is not limited herein.

Figure 3:
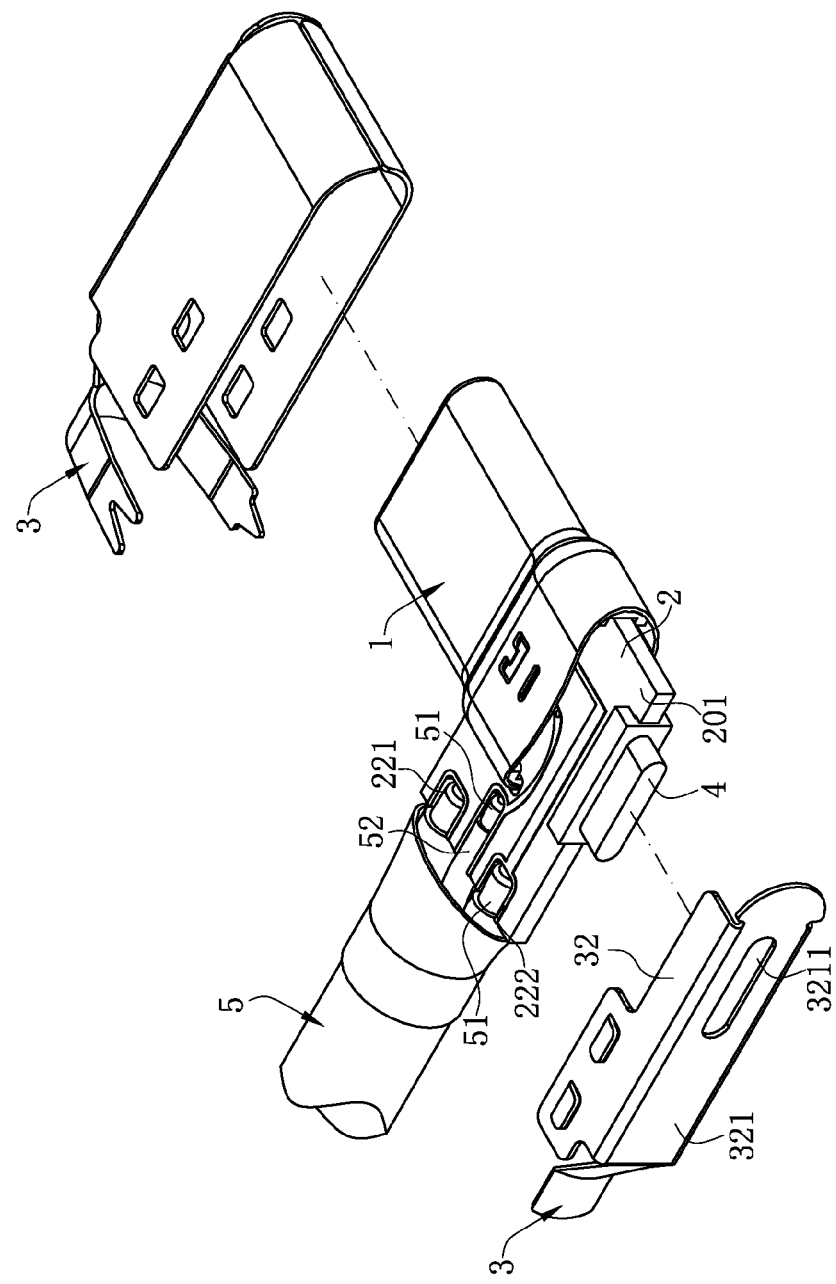
FIG. 3 is a partial three-dimensional exploded view in another direction of a first embodiment of an assembly of a cable connection apparatus and an electrical connector according to the present invention.
Figure 6:
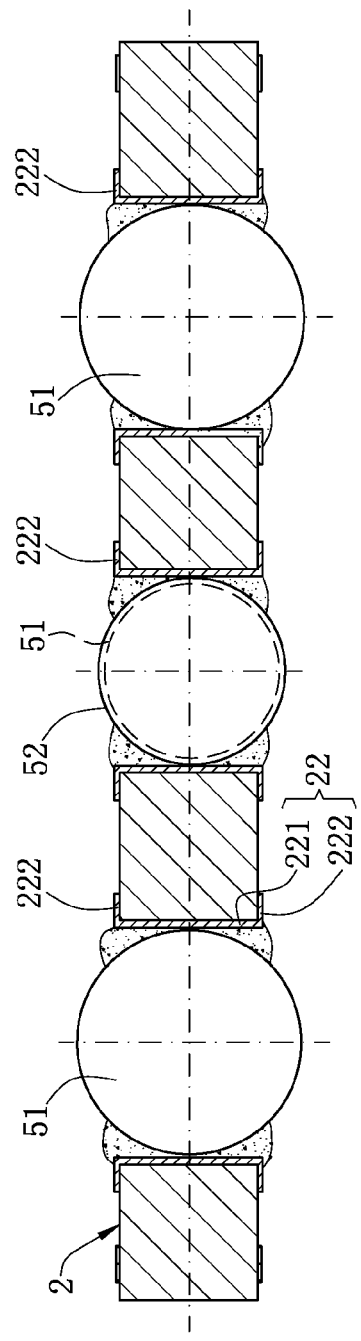
FIG. 6 is a sectional view along a direction A-A of a first embodiment of an assembly of a cable connection apparatus and an electrical connector according to the present invention.

As shown in FIGS. 3, 5 and 6, the conducting wire 51 is soldered into the metal conductor 22 in the corresponding notch 21, thereby reducing the height by which the soldering end of the conducting wire 51 protrudes from the surface of the circuit board 2. In this embodiment, a cross-sectional diameter of the conducting wire 51 is slightly greater than the thickness of the circuit board 2, and therefore the soldering end of the conducting wire 51 slightly protrudes from the surface of the circuit board 2, but does not go so far as to interfere with the metal shell 3, to cause the conducting wire 51 to be short-circuited. In other embodiments, the cross-sectional diameter of the conducting wire 51 may be less than the thickness of the circuit board 2, which is not limited herein.

As shown in FIGS. 5 and 6, the width of the notch 21 is gradually widened in a direction from the edge of the circuit board 2 to the center of the circuit board 2. Thus, not only the conducting wire 51 may be easily inserted into the notch 21, but also undesired contact between the conducting wire 51 and the notch 21 because of an excessively large gap, which affects stability of the assembly 100 of a cable connection apparatus and an electrical connector, may be avoided. In addition, widths of two notches 21 at edges of the circuit board 2 are greater than the width of the middle notch 21, so that the notches 21 at two edges may be soldered to a conducting wire 51 whose cross-sectional area is larger, so as to satisfy a requirement that when the conducting wires 51 at two edges are used as power supply wires or grounding wires, a large current needs to be transmitted without excessively heating. The depth of the middle notch 21 is greater than depths of the notches 21 at two edges, the middle insulating layer 52 partially enters the middle notch 21, and the depth by which the middle insulating layer 52 enters the middle notch 21 is greater than or equal to the depths of the notches 21 at the two edges. Thus, staggered positions are formed between a soldering end of the middle conducting wire 51 and soldering ends of the conducting wires 51 at two edges, so as to prevent tin (not labeled) from being melted and flowing to the middle conducting wire 51 to cause short-circuit when the conducting wires 51 at the two edges are soldered to the corresponding notches 21.

FIGS. 1 to 6 show a first embodiment of the assembly 100 of a cable connection apparatus and an electrical connector of the present invention. In this embodiment, an insertion direction of the mating plug 1 and a mating socket connector (not shown) is at 90 degrees relative to a direction in which the cable 5 is inserted into the at least one notch 21. The circuit board 2 has a first area 201 and a second area 202 that are distributed at two ends of the circuit board 2. The notch 21 is located at the second area 202. An open slot 23 is depressed from a side edge of the circuit board 2. The open slot 23 is located between the first area 201 and the second area 202. The mating plug 1 is disposed at a side of the circuit board 2, connected to the first area 201 and locked in the open slot 23. A locking slot 24 is depressed from the open slot 23 in a direction toward the first area 201. The locking slot 24 runs through the upper and lower surfaces of the circuit board 2, and is locked in the insulating body (not labeled). By a locking force between the open slot 23 and the locking slot 24, the mating plug 1 may be stably soldered into the circuit board 2. The assembly 100 of a cable connection apparatus and an electrical connector further includes a positioning block 4. The metal shell 3 has a first side wall 311 and a second side wall 321 that are parallel to a depression direction of the notch 21. The first side wall has a mating ring 3111. The second portion passes through the mating ring 3111 on the first side wall 311 and is located outside the metal shell 3. The positioning portion is fixed to the second side wall 321. In certain embodiments, the metal shell 3 is formed by assembling a first metal shell 31 and a second metal shell 32 horizontally. The first metal shell 31 and the second metal shell 32 respectively have a first side wall 311 and a second side wall 321, and the first side wall 311 and the second side wall 321 are parallel to a depression direction of the notch 21. The first side wall 311 has a mating ring 3111. The mating plug 1 passes through the mating ring 3111 and is electrically conducted to the circuit board 2, and the insulating body (not labeled) is locked to the circuit board 2. The second side wall 321 has a positioning ring 3211. The positioning block 4 passes through the positioning ring 3211 and is locked to the circuit board 2. The circuit board 2 is positioned by locking with the positioning block 4 and the insulating body (not labeled). In certain embodiments, both the height and the width of the first portion are respectively greater than the height and the width of the second portion, and the part of the second portion that is adjacent to the first portion urges the metal shell 3. In certain embodiments, only the width of the first portion is greater than the width of the second portion, or only the height of the first portion is greater than the height of the second portion, as long as the part of the second portion adjacent to the first portion urges the metal shell 3, and prevents the mating plug 1 from too much displacement forward and being separated from the metal shell 3.

Figure 7:
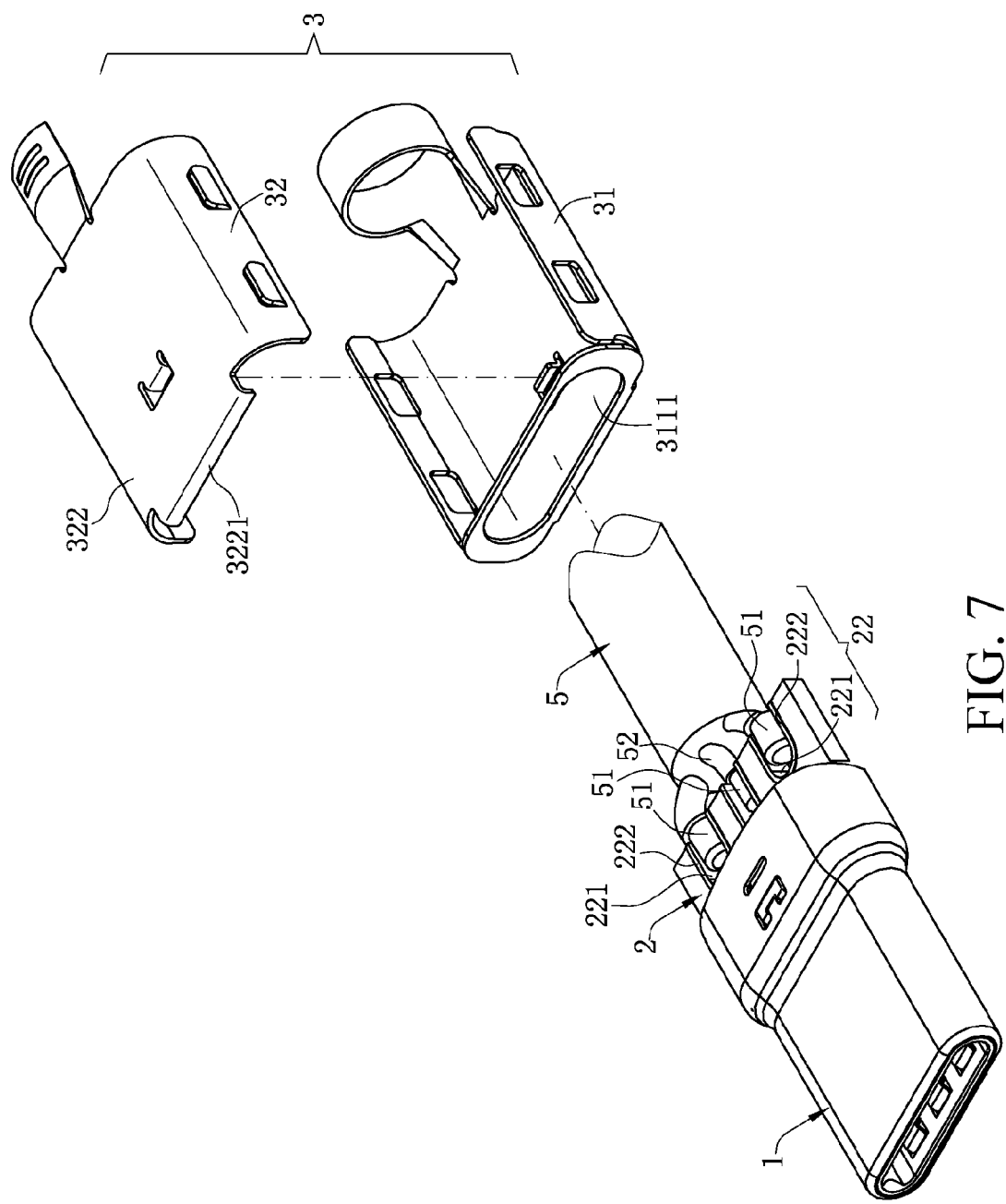
FIG. 7 is a partial three-dimensional exploded view of a second embodiment of an assembly of a cable connection apparatus and an electrical connector according to the present invention.
Figure 8:
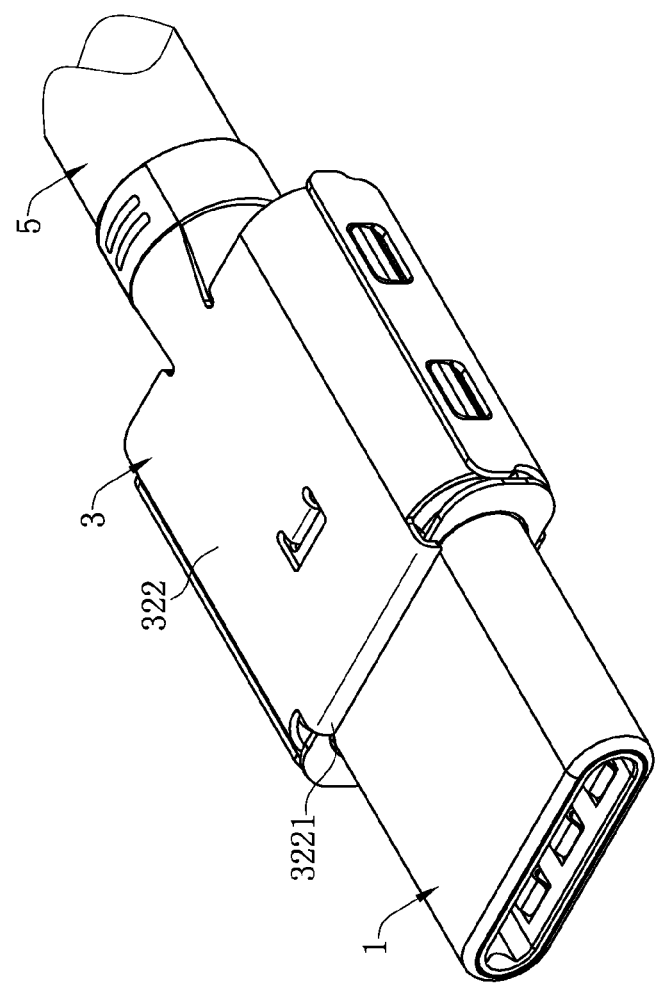
FIG. 8 is a schematic three-dimensional assembly view of a second embodiment of an assembly of a cable connection apparatus and an electrical connector according to the present invention.

FIGS. 7 and 8 show a second embodiment of an assembly 100 of a cable connection apparatus and an electrical connector of the present invention. The second embodiment and the first embodiment are different in that an insertion direction of the mating plug 1 and a mating socket connector (not shown) is parallel to a direction in which the cable 5 is inserted into the notch 21, the metal shell 3 is formed by assembling the first metal shell 31 and the second metal shell 32 vertically, an external perimeter of the first portion is greater than an external perimeter of the second portion, a part of the second portion that is adjacent to the first portion urges the metal shell 3, a front end of the first metal shell 31 is provided with the mating ring 3111, the second metal shell 32 has a top wall 322, the top wall 322 extends forward and is bent downward to form a buckling portion 3221, the buckling portion 3221 buckles a front end of the mating ring 3111, so as to enhance stability of the mating ring 3111, thereby preventing a resistance from being generated when the mating plug 1 passes through the mating ring 3111, to cause the mating ring 3111 to be deformed, which damages the metal shell 3, and affects a shielding effect of the metal shell 3.

In summary, the assembly 100 of a cable connection apparatus and an electrical connector according to certain embodiments of the present invention, among other things, has the following beneficial advantages.

(1) The conducting wire 51 enters the at least one notch 21 and is soldered to the circuit board 2, thereby reducing the height by which a soldering end of the conducting wire 51 protrudes from a surface of the circuit board 2 after the conducting wire 51 is soldered to the circuit board 2, so that the metal casing 3 outside the circuit board 2 may still wrap the circuit board 2 without being provided with a protruding portion for reserving the soldering end of the conducting wire 51, which facilitates lightening and thinning design of the assembly 100 of a cable connection apparatus and an electrical connector. Meanwhile the soldering end of the conducting wire 51 can achieve a good shielding effect, thereby improving signal transmission quality of the circuit board 2.

(2) The opening width of the "U" shaped notch 21 is slightly less than the cross-sectional diameter of the conducting wire 51. Therefore the conducting wire 51 may be in interference fit with the metal conductor 22 when being inserted into the notch 21, ensuring that the two may be in firm and stable contact with each other.

(3) The width of the notch 21 is gradually widened in the direction from the edge of the circuit board 2 to the center of the circuit board 2, which effectively reduces a resistance when the conducting wire 51 is inserted into the notch 21, thereby preventing the circuit board 2 from being damaged during the insertion process.

(4) Widths of two notches 21 at edges of the circuit board 2 are greater than the width of the middle notch 21, so that the notches 21 at two edges may be soldered to a conducting wire 51 whose cross-sectional area is larger, so as to satisfy a requirement that when the conducting wires 51 at two edges are used as power supply wires or grounding wires, a large current can be transmitted without excessive heating.

(5) The depth of the middle notch 21 is greater than depths of the notches 21 at two edges, and the depth by which the middle insulating layer 52 partially enters the middle notch 21 is greater than or equal to the depths of the two notches 21 at the two edges. Thus, staggered positions are formed between a soldering end of the middle conducting wire 51 and soldering ends of the conducting wires 51 at two edges, so as to prevent tin (not labeled) from being melted and flowing to the middle conducting wire 51 to be short-circuited when the conducting wires 51 at the two edges are soldered to the corresponding notches 21.

(6) The first metal conductor 221 is attached to the inner wall of the notch 21, the second metal conductor 222 extends to a surface of the circuit board 2 from the first metal conductor 221, is located at an edge of the notch 21 and is attached to the surface of the circuit board 2. Thus the metal conductor 22 completely wraps the notch 21, thereby increasing a soldering area between the conducting wire 51 and the metal conductor 22, and improving signal transmission stability of the conducting wire 51.

(7) Open slot 23 and the locking slot 24 are formed between the first area 201 and the second area 202. The open slot 23 and the locking slot 24 cooperate with the mating plug 1 to form a locking force, which enables the mating plug 1 to be stably soldered to the circuit board 2.

(8) The complete ring-shaped mating ring 3111 formed on the first metal shell 31 is provided for the mating plug 1 to pass through, which prevents a seam from occurring in the mating ring 3111, thereby improving the shielding effect of the metal shell 3.

(9) The buckling portion 3221 disposed at the front end of the second metal shell 32 buckles the mating ring 3111, thereby improving stability of the mating ring 3111, and prolonging the service life of the metal shell 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An assembly of a cable connection apparatus and an electrical connector, comprising:

a mating plug having an insulating body and a plurality of terminals disposed at the insulating body;
   a circuit board electrically conducted with the terminals, having at least one notch depressed from an edge at a side of the circuit board toward a center direction of the circuit board, and a metal conductor disposed in the notch or at an edge of the notch; and
   a cable having at least one conducting wire, wherein the conducting wire is inserted into the notch along a depression direction of the notch, and conducted to the metal conductor,
   wherein the metal conductor comprises:
      a first metal conductor, completely tightly attached to an inner wall of the notch; and
      a second metal conductor, extending out of the notch from the first metal conductor to a surface of the circuit board and tightly attached to upper and lower surfaces of the circuit board.

2. The assembly of claim 1, wherein a width of the notch is gradually widened in a direction from the edge of the circuit board to the center of the circuit board.

3. The assembly of claim 1, wherein there are at least three notches, the notches are arranged in a row and comprise a head notch, a tail notch, and a middle notch disposed between the head notch and the tail notch, and a width of the head notch and a width of the tail notch are greater than a width of the middle notch.

4. The assembly of claim 1, wherein an insertion direction of the mating plug is at 90 degrees relative to a direction in which the cable is inserted into the notch.

5. The assembly of claim 1, wherein the second metal conductor is perpendicular to the first metal conductor, and two second metal conductors located at the upper and lower surfaces of the circuit board are parallel to each other.

6. The assembly of claim 1, wherein the mating plug is a universal serial bus (USB) Type C male plug connector.

7. The assembly of claim 1, wherein the circuit board is further wrapped with a metal shell, the metal shell is formed by assembling a first metal shell and a second metal shell horizontally.

8. The assembly of claim 1, wherein the conducting wire is cylindrical, and a center line of the conducting wire is at an equal distance to two opposite outer surfaces of the circuit board.

9. The assembly of claim 8, wherein a cross-sectional diameter of the conducting wire is greater than the thickness of the circuit board.

10. The assembly of claim 8, wherein a cross-sectional diameter of the conducting wire is less than the thickness of the circuit board.

11. The assembly of claim 1, wherein the notch is in a shape of U, and the metal conductor is attached to an inner wall of the notch.

12. The assembly of claim 11, wherein two opposite inner surfaces of the metal conductor are attached to a surface of the conducting wire.

13. The assembly of claim 1, wherein there are at least three notches, the notches are arranged in a row and comprises a head notch, a tail notch, and a middle notch disposed between the head notch and the tail notch, and a depth of the middle notch is greater than a depth of the head notch and a depth of the tail notch.

14. The assembly of claim 13, wherein there are at least three conducting wires, the conducting wires are distributed corresponding to the notches, each of the conducting wires is wrapped with an insulating layer, the insulating layer of a middle conducting wire that corresponds to the middle notch partially enters the middle notch, and a depth by which the insulating layer enters the middle notch is greater than or equal to the depth of the head notch and the depth of the tail notch.

15. The assembly of claim 1, wherein the circuit board has a first area and a second area that are distributed at two ends of the circuit board, the notch is located at the second area, an open slot is depressed from a side edge of the circuit board, the open slot is located between the first area and the second area, and the mating plug is disposed at a side of the circuit board, connected to the first area and locked in the open slot.

16. The assembly of claim 15, wherein a locking slot is depressed from the open slot in a direction toward the first area, and the locking slot runs through the upper and lower surfaces of the circuit board, and is locked in the insulating body.

17. The assembly of claim 1, wherein the circuit board is further wrapped with a metal shell, the mating plug has a first portion and a second portion, the first portion is located inside the metal shell, and the second portion is located outside the metal shell.

18. The assembly of claim 17, wherein the metal shell has a mating ring, and the second portion passes through the mating ring to be located outside the metal shell.

19. The assembly of claim 17, wherein the metal shell has a first side wall, the first side wall is parallel to the depression direction of the notch, and the second portion passes through the first side wall to be located outside the metal shell.

20. The assembly of claim 17, wherein at least one of a width and a height of the first portion is respectively greater than a width and a height of the second portion, and a part of the second portion adjacent to the first portion urges the metal shell.

21. The assembly of claim 17, wherein the metal shell is formed by assembling a first metal shell and a second metal shell vertically, an external perimeter of the first portion is greater than an external perimeter of the second portion, and a part of the second portion adjacent to the first portion urges the metal shell.

22. The assembly of claim 21, wherein a front end of the first metal shell is provided with a mating ring, a front end of the second metal shell is provided with a buckling portion, the second portion passes through the mating ring to be located outside the metal shell, and the buckling portion buckles the mating ring.

23. The assembly of claim 1, wherein the circuit board is further wrapped with a metal shell, and the circuit board is fixed inside the metal shell through a positioning portion.

24. The assembly of claim 23, wherein the positioning portion is a positioning block that is separately formed, the metal shell is provided with a positioning ring, one end of the positioning block is fixed to the circuit board, and the other end of the positioning block passes through the positioning ring and is fixed to the circuit board.

25. The assembly of claim 23, wherein the metal shell has a second side wall, the second side wall is parallel to the depression direction of the notch, and the positioning portion is fixed to the second side wall.

26. A cable connection apparatus, comprising:
a circuit board, having a plurality of conducting channels, at least one notch depressed from an edge at a side of the circuit board toward a center direction of the circuit board, and a metal conductor correspondingly disposed in the notch or at an edge of the notch, wherein the metal conductor comprises:
a first metal conductor completely tightly attached to an inner wall of the notch, and
a second metal conductor extending out of the notch from the first metal conductor to a surface of the circuit board and tightly attached to upper and lower surfaces of the circuit board,
wherein each of the first metal conductor and the second metal conductor electrically conducting to at least one of the conducting channels; and
a cable having at least one conducting wire, wherein the conducting wire is inserted into the notch along a depression direction of the notch and contacts the metal conductor.

27. The cable connection apparatus of claim 26, wherein the conducting wire is cylindrical, and a center line of the conducting wire is at an equal distance to two opposite outer surfaces of the circuit board.

28. The cable connection apparatus of claim 26, wherein the notch is in a shape of U, and the metal conductor is attached to an inner wall of the notch.

29. The cable connection apparatus of claim 26, wherein there are at least three notches, the notches are arranged in a row and comprises a head notch, a tail notch, and a middle notch disposed between the head notch and the tail notch, and a width of the head notch and a width of the tail notch are greater than a width of the middle notch.

30. The cable connection apparatus of claim 26, wherein there are at least three notches, the notches are arranged in a row and comprises a head notch, a tail notch, and a middle notch disposed between the head notch and the tail notch, and a depth of the middle notch is greater than a depth of the head notch and a depth of the tail notch.

31. The cable connection apparatus of claim 30, wherein there are at least three conducting wires, the conducting wires are distributed corresponding to the notches, each of the conducting wires is wrapped with an insulating layer, the insulating layer of a middle conducting wire that corresponds to the middle notch partially enters the middle notch, and a depth by which the insulating layer enters the middle notch is greater than or equal to the depth of the head notch and the depth of the tail notch.

* * * * *